US009055694B2

(12) United States Patent
Lima (10) Patent No.: US 9,055,694 B2
(45) Date of Patent: *Jun. 9, 2015

(54) THERMAL INTERFACE MEMBERS FOR REMOVABLE ELECTRONIC DEVICES

(75) Inventor: David J. Lima, Los Altos, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 352 days.

This patent is subject to a terminal disclaimer.

(21) Appl. No.: 13/551,024

(22) Filed: Jul. 17, 2012

(65) Prior Publication Data

US 2012/0281365 A1 Nov. 8, 2012

Related U.S. Application Data

(63) Continuation of application No. 12/616,497, filed on Nov. 11, 2009, now Pat. No. 8,223,498.

(51) Int. Cl.
*H05K 7/20* (2006.01)
*H05K 13/04* (2006.01)
*H05K 1/02* (2006.01)

(52) U.S. Cl.
CPC ....... *H05K 7/20418* (2013.01); *Y10T 29/49117* (2015.01); *H05K 7/205* (2013.01); *H05K 1/0209* (2013.01); *H05K 1/0204* (2013.01)

(58) Field of Classification Search
CPC . H05K 7/20418; H05K 7/205; H05K 1/0204; H05K 1/0209; Y10T 29/49117
USPC ......... 361/704, 707, 709, 710, 714, 715, 720; 385/92; 372/36; 353/57; 362/294, 345, 362/373, 580, 547, 218, 264; 398/117, 164
See application file for complete search history.

(56) References Cited

U.S. PATENT DOCUMENTS

| 4,133,022 A | 1/1979 | Moore et al. |
| 5,077,638 A | 12/1991 | Andersson et al. |

(Continued)

FOREIGN PATENT DOCUMENTS

| JP | 2010085805 | 4/2010 |
| WO | WO 03/060583 A1 | 7/2003 |

OTHER PUBLICATIONS

The Gund Company, Inc., "Material Data Sheet, Mylar® Polyester Film Type El-21," not dated, 4 pages.

(Continued)

*Primary Examiner* — Anatoly Vortman
(74) *Attorney, Agent, or Firm* — Cooley LLP (57) ABSTRACT

In some embodiments, an apparatus includes a printed circuit board and a thermal interface member. The printed circuit board is configured to be coupled to an electronic device, such as, for example, a removable (or "pluggable") optical transceiver. A first surface of the printed circuit board includes a thermally-conductive portion, and a second surface of the printed circuit board includes a thermally-conductive portion that is coupled to the thermally-conductive portion of the first surface by a thermally-conductive via between the first surface and the second surface. The thermal interface member is coupled to the first surface of the printed circuit board such that a portion of the thermal interface member is in contact with the thermally-conductive portion of the first surface. The portion of the thermal interface member is deformable and thermally-conductive.

17 Claims, 8 Drawing Sheets

(56) References Cited

U.S. PATENT DOCUMENTS

| | | |
|---|---|---|
| 5,477,416 A | 12/1995 | Schkrohowsky et al. |
| 5,545,473 A | 8/1996 | Ameen et al. |
| 5,758,413 A | 6/1998 | Chong et al. |
| 5,912,801 A | 6/1999 | Roy et al. |
| 5,973,923 A | 10/1999 | Jitaru |
| 6,002,587 A | 12/1999 | Shusa et al. |
| 6,002,588 A | 12/1999 | Vos et al. |
| 6,094,349 A | 7/2000 | Fassel et al. |
| 6,163,454 A | 12/2000 | Strickler |
| 6,198,630 B1 | 3/2001 | Cromwell |
| 6,312,287 B1 | 11/2001 | Harting et al. |
| 6,330,745 B1 | 12/2001 | Cromwell et al. |
| 6,339,875 B1 | 1/2002 | Larson |
| 6,372,997 B1 | 4/2002 | Hill et al. |
| 6,391,442 B1 * | 5/2002 | Duvall et al. ............ 428/348 |
| 6,449,150 B1 | 9/2002 | Boone |
| 6,508,595 B1 | 1/2003 | Chan et al. |
| 6,545,879 B1 | 4/2003 | Goodwin |
| 6,600,611 B2 | 7/2003 | Inujima et al. |
| 6,768,640 B2 | 7/2004 | Doblar et al. |
| 6,778,386 B2 | 8/2004 | Garnett et al. |
| 6,816,376 B2 | 11/2004 | Bright et al. |
| 6,823,915 B2 | 11/2004 | Schwarzbauer |
| 6,835,453 B2 | 12/2004 | Greenwood et al. |
| 6,860,649 B2 | 3/2005 | Edwards et al. |
| 6,893,293 B2 | 5/2005 | Ice et al. |
| 6,912,131 B2 | 6/2005 | Kabat |
| 6,916,122 B2 | 7/2005 | Branch et al. |
| 6,922,516 B2 | 7/2005 | Kurashima et al. |
| 6,935,882 B2 | 8/2005 | Hanley et al. |
| 6,940,723 B2 | 9/2005 | Ice et al. |
| 6,980,437 B2 | 12/2005 | Bright |
| 6,986,679 B1 | 1/2006 | Aronson et al. |
| 7,048,452 B2 | 5/2006 | Malagrino, Jr. |
| 7,057,895 B2 | 6/2006 | Mejia et al. |
| 7,074,123 B2 | 7/2006 | Bettridge et al. |
| 7,074,490 B2 | 7/2006 | Feng et al. |
| 7,112,131 B2 | 9/2006 | Rasmussen et al. |
| 7,145,773 B2 | 12/2006 | Shearman et al. |
| 7,154,748 B2 | 12/2006 | Yamada |
| 7,164,581 B2 | 1/2007 | Carullo et al. |
| 7,178,996 B2 | 2/2007 | Malagrino, Jr. et al. |
| 7,195,403 B2 | 3/2007 | Oki et al. |
| 7,209,351 B2 | 4/2007 | Wei |
| 7,224,582 B1 | 5/2007 | Saturley et al. |
| 7,239,515 B2 | 7/2007 | Bulman-Fleming et al. |
| 7,248,479 B2 | 7/2007 | Summers et al. |
| 7,256,995 B2 | 8/2007 | Wrycraft et al. |
| 7,317,617 B2 | 1/2008 | Meadowcraft et al. |
| 7,322,850 B2 | 1/2008 | Neer et al. |
| 7,369,411 B2 | 5/2008 | Hill et al. |
| 7,371,965 B2 | 5/2008 | Ice |
| 7,491,090 B2 | 2/2009 | Oki et al. |
| 7,511,947 B2 | 3/2009 | Leng et al. |
| 7,530,835 B2 | 5/2009 | Yu et al. |
| 7,722,359 B1 | 5/2010 | Frangioso, Jr. et al. |
| 7,808,792 B2 | 10/2010 | Nguyen |
| 7,813,120 B2 | 10/2010 | Vinson et al. |
| 7,826,222 B2 | 11/2010 | Aybay et al. |
| 7,885,066 B2 | 2/2011 | Boyden et al. |
| 7,898,808 B2 | 3/2011 | Joiner et al. |
| 7,974,098 B2 | 7/2011 | Oki et al. |
| 8,223,498 B2 | 7/2012 | Lima |
| 8,535,787 B1 | 9/2013 | Lima |
| 2002/0018339 A1 | 2/2002 | Uzuka et al. |
| 2002/0126449 A1 | 9/2002 | Casebolt |
| 2003/0002824 A1 | 1/2003 | Chan et al. |
| 2003/0141090 A1 | 7/2003 | Kruger et al. |
| 2003/0161108 A1 | 8/2003 | Bright et al. |
| 2003/0169983 A1 | 9/2003 | Branch et al. |
| 2003/0236019 A1 | 12/2003 | Hanley et al. |
| 2004/0001311 A1 | 1/2004 | Doblar et al. |
| 2004/0052998 A1 | 3/2004 | Freuler et al. |
| 2004/0101257 A1 | 5/2004 | Kruger et al. |
| 2004/0130868 A1 | 7/2004 | Schwartz et al. |
| 2004/0203289 A1 | 10/2004 | Ice et al. |
| 2004/0264145 A1 | 12/2004 | Miller et al. |
| 2005/0058790 A1 | 3/2005 | Simon et al. |
| 2005/0135066 A1 * | 6/2005 | Lee et al. .................. 361/704 |
| 2005/0207134 A1 | 9/2005 | Belady et al. |
| 2005/0220425 A1 | 10/2005 | Kropp et al. |
| 2005/0226571 A1 | 10/2005 | Malagrino et al. |
| 2005/0281005 A1 | 12/2005 | Carullo et al. |
| 2006/0002084 A1 | 1/2006 | Wei |
| 2006/0126292 A1 | 6/2006 | Pfahnl et al. |
| 2006/0270275 A1 | 11/2006 | Morohashi et al. |
| 2006/0274518 A1 | 12/2006 | Yu et al. |
| 2007/0134003 A1 | 6/2007 | Lee et al. |
| 2007/0223199 A1 | 9/2007 | Fujiya et al. |
| 2008/0031620 A1 | 2/2008 | Hudgins et al. |
| 2008/0232067 A1 | 9/2008 | Joiner et al. |
| 2008/0247762 A1 | 10/2008 | Yoshikawa et al. |
| 2008/0271875 A1 | 11/2008 | Lima |
| 2009/0101274 A1 | 4/2009 | Olson et al. |
| 2009/0166854 A1 | 7/2009 | Jewram et al. |
| 2009/0296352 A1 | 12/2009 | Lima |
| 2010/0014248 A1 | 1/2010 | Boyden et al. |
| 2011/0011562 A1 | 1/2011 | Aybay et al. |
| 2011/0011567 A1 | 1/2011 | Aybay et al. |
| 2011/0056660 A1 | 3/2011 | Aybay et al. |
| 2011/0182027 A1 | 7/2011 | Lima |

OTHER PUBLICATIONS

DuPoint Teijin Films, Datasheet [online], [retrieved on Jun. 19, 2009]. Retrieved from the Internet: <URL:http://www.mylarcom/FilmEnterprise/Datasheet.asp?ID=406&Version=US>, 3 pages.

Chomerics, "THERMFLOW® Thermal Interface Material Application Guide," AN 1002 EN 08/07 Rev A, 5 pages.

Fujipoly—Sarcon Thermal Interface Materials [online], [retrieved on Jun. 18, 2009]. Retrieved from the Internet: <URL:http://www.fujipoly.com/products/genProductLine.asp?ProductLine=Sarcon_Thermal_Interface_Materials>, 3 pages.

Chomerics, "THERMFLOW® T777, Low Thermal Resistance THERMFLOW® Phase Change Pad Polymer Solder Hybrid (PSH) Thermal Interface Material," TB 1027 EN 08/07 Rev A, 2 pages.

David J. Lima, "Heat Sinks Having a Thermal Interface for Cooling Electronic Devices" U.S. Appl. No. 12/493,829, filed Jun. 29, 2009, (28 pgs).

DuPoint Teijin Films, "Mylar® polyester film, Product Information," 222367D, Jun. 2003, 6 pages.

Office Action mailed Feb. 1, 2012 for U.S. Appl. No. 12/493,829 (13 pages).

Office Action mailed Mar. 14, 2012 for U.S. Appl. No. 12/566,425 (11 pages).

* cited by examiner

THERMAL INTERFACE MEMBERS FOR REMOVABLE ELECTRONIC DEVICES

CROSS-REFERENCE TO RELATED APPLICATIONS

This application is a continuation of U.S. application Ser. No. 12/616,497, entitled "THERMAL INTERFACE MEMBERS FOR REMOVABLE ELECTRONIC DEVICES," filed Nov. 11, 2009, which is incorporated by reference herein in its entirety.

This application is also related to U.S. patent application Ser. No. 12/493,829, entitled "Heat Sinks Having a Thermal Interface for Cooling Electronic Devices," filed Jun. 29, 2009, which is incorporated herein by reference in its entirety.

BACKGROUND

This invention relates to apparatus and methods for cooling electronic devices, such as, for example, thermal interface members for cooling removable (or "pluggable") electronic devices.

Some known electronic devices are manufactured according to industry standards that specify the size, shape, form factor and/or electronic performance of the electronic device. The use of such standards allows similar electronic devices produced by different manufacturers to be used interchangeably within a data processing unit (e.g., a router, a switch, a server and/or the like). Because the size, shape and/or form factor of such known electronic devices are dictated by such industry standards, in certain instances limited flexibility may exist to change the design of an electronic device to improve heat dissipation, increase power levels or the like. Accordingly, some known data processing units include heat sinks and/or other ancillary devices external to the data processing to improve the overall performance of such electronic devices.

For example, some known optical transceivers are manufactured according to an industry standard known as the Small Form-factor Pluggable (SFP) standard. Optical transceivers manufactured according to the SFP standard are configured to be "pluggable" such that the optical transceiver can be inserted and/or removed from the host data processing unit without removing power from the unit. Some such optical transceivers are installed inside of the host data processing unit within a protective cage or enclosure that includes a heat sink to dissipate heat from a top surface of the optical transceiver. Such known configurations, however, do not include any mechanism for promoting heat transfer from the bottom surface of the optical transceiver.

Thus, a need exists for improved apparatus and methods for apparatus and methods for cooling electronic devices.

SUMMARY

Printed circuit boards having thermal interface members for cooling removable electronic devices in data processing units are described herein. In some embodiments, an apparatus includes a printed circuit board and a thermal interface member. The printed circuit board is configured to be coupled to an electronic device, such as, for example, a removable (or "pluggable") optical transceiver. A first surface of the printed circuit board includes a thermally-conductive portion, and a second surface of the printed circuit board includes a thermally-conductive portion that is coupled to the thermally-conductive portion of the first surface by a thermally-conductive via between the first surface and the second surface. The thermal interface member is coupled to the first surface of the printed circuit board such that a portion of the thermal interface member is in contact with the thermally-conductive portion of the first surface. The portion of the thermal interface member is deformable and thermally-conductive.

DETAILED DESCRIPTION

Printed circuit boards having a thermal interface for cooling electronic devices are described herein. In some embodiments, an apparatus includes a printed circuit board and a thermal interface member. The printed circuit board is configured to be coupled to an electronic device, such as, for example, a removable optical transceiver. A first surface of the printed circuit board includes a thermally-conductive portion, and a second surface of the printed circuit board includes a thermally-conductive portion that is coupled to the thermally-conductive portion of the first surface by a thermally-conductive via between the first surface and the second surface. The thermal interface member is coupled to the first surface of the printed circuit board such that a portion of the thermal interface member is in contact with the thermally-conductive portion of the first surface. The portion of the thermal interface member is deformable and thermally-conductive. In some embodiments, the thermal interface member can be constructed from a material having high tear resistance, high abrasion resistance, high thermal conductivity and/or a low coefficient of friction. In some embodiments, at least a portion of the thermal interface member can be constructed from a thermally-conductive gel.

In some embodiments, a data processing unit includes a printed circuit board, a frame and a thermal interface member. The data processing unit can be, for example, a component or subsystem within a core switch fabric of a data center. The printed circuit board is configured to be coupled to an electronic device, such as, for example an pluggable optical transceiver. The frame is coupled to a first surface of the printed circuit board, and defines, at least in part, an internal volume within which at least a portion of the electronic device can be disposed. The frame further defines an opening. The thermal interface member is coupled to the first surface of the printed circuit board such that a portion of the thermal interface member is disposed within the opening of the frame and the thermal interface member is in contact with the electronic device.

In some embodiments, a method includes coupling a thermal interface member to a thermally-conductive portion of a first surface of a printed circuit board. The printed circuit board includes a second surface having a thermally-conductive portion that is coupled to the thermally-conductive portion of the first surface by a thermally-conductive via between the first surface and the second surface. A frame is coupled to the first surface of the printed circuit board such that a portion of the thermal interface member is disposed within an opening defined by the frame. The frame defines, at least in part, an internal volume within which at least a portion of an electronic device can be disposed.

As used herein the term "data processing unit" refers to, for example, any computer, electronic switch, switch fabric, portion of a switch fabric, router, host device, data storage device, line card or the like used to process, transmit and/or convey electrical and/or optical signals. A data processing unit can include, for example, a component included within an electronic communications network. In some embodiments, for example, a data processing unit can be a component or subsystem included within or forming a portion of a core switch fabric of a data center. In other embodiments, a data processing unit can be an access switch located at an edge of a data center, or a host or peripheral device (e.g., a server) coupled to the access device. For example, an access switch can be located on top of a chassis containing several host devices.

As used herein the term "electronic device" refers to any component within a data processing unit that is configured to perform an electronic function associated with the data processing unit. An electronic device can include, for example, a switching device, a converter, a receiver, a transmitter, a signal conditioner, an amplifier or the like. In some embodiments, an electronic device can include an optical transceiver configured to convert electrical signals into optical signals and vice versa.

Figure 1:
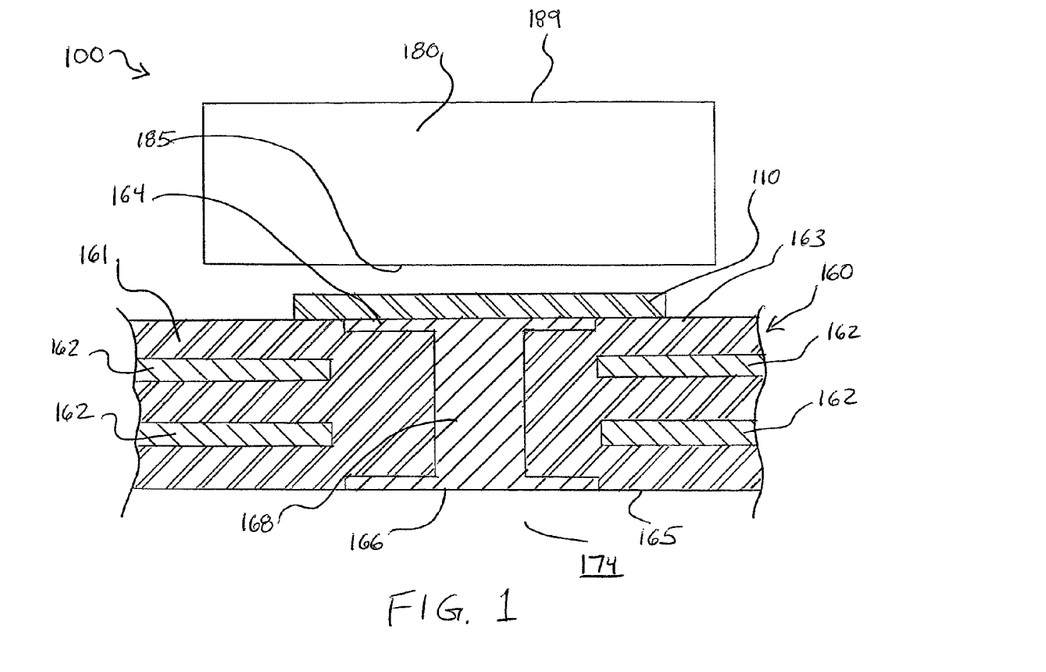
FIGS. 1 and 2 are cross-sectional side views of a portion of a data processing unit having a thermal interface member, according to an embodiment, in a first configuration and a second configuration, respectively.
Figure 2:
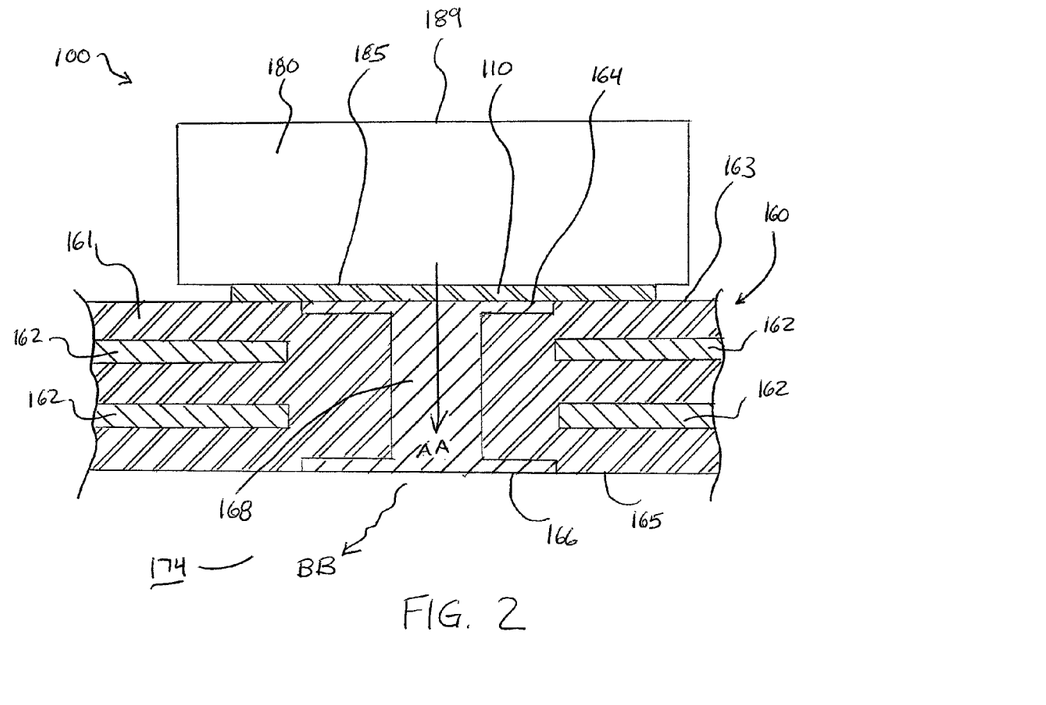

FIGS. 1 and 2 are a cross-sectional views of a portion of a data processing unit 100 according to an embodiment, in a first configuration (FIG. 1) and a second configuration (FIG. 2). The data processing unit 100 includes a printed circuit board 160, an electronic device 180 and a thermal interface member 110. The electronic device 180 can be any suitable electronic device configured to perform, at least in part, the functions of the data processing unit 100. The electronic device 180 can be, for example, a pluggable optical transceiver. The electronic device 180 includes a first (or top) surface 189 and a second (or bottom) surface 185. The electronic device 180 can be removably coupled to the data processing unit 100 and/or the printed circuit board 160, as shown in FIG. 2. Although the electronic device 180 is shown as being coupled to a first surface 163 of the printed circuit board 160 via the thermal interface member 110, in other embodiments, the electronic device 180 can be coupled to any portion of the printed circuit board 160.

The printed circuit board 160 includes the first (or top) surface 163 and a second (or bottom) surface 165. The printed circuit board 160 includes a series of conductive layers 162 surrounded and/or separated by an insulating material 161. The conductive layers 162 can be, for example, layers of foil copper that define a series of electrical paths through which the electronic device 180 and other electronic components (not shown) can be coupled. In this manner, the printed circuit board 160, the electronic device 180 and other electronic components (e.g., modules, connectors, and the like, which are not shown in FIGS. 1 and 2) can collectively perform, at least in part, the functions of the data processing unit 100. The connection between the electronic device 180 and the conductive layers 162 is not shown in FIG. 2 for the purposes of clarity. Although shown as including two conductive layers 162, in other embodiments, the printed circuit board 160 can include any number of conductive layers. The insulating material 161 can be any suitable material, such as, for example, plastic, epoxy or the like.

The first surface 163 of printed circuit board 160 includes a thermally-conductive portion 164, and the second surface 165 of printed circuit board 160 includes a thermally-conductive portion 166. In some embodiments, the thermally-conductive portions 164, 166 can be similar in construction to the conductive layers 162. For example, in some embodiments, the thermally-conductive portion 164 of the first surface 163 and/or the thermally-conductive portion 166 of the second surface 165 can be a copper foil layer disposed on a portion of the first surface 163 and/or the second surface 165, respectively. Moreover, to enhance the thermal conductivity, the outer surface of the thermally-conductive portions 164, 166 can be devoid of any coatings (e.g., solder mask, epoxy or the like). In other embodiments, the thermally-conductive portions 164, 166 can include a material that is coated to a portion of the first surface 163 and/or the second surface 165, respectively. For example, in some embodiments, the thermally-conductive portion 164 can include a thermally-conductive material that is spray-coated to the first surface 163 by any suitable method. Suitable methods of spray-coating can include, for example, sputter coating, thermal spray coating, plasma coating, physical vapor deposition, chemical vapor deposition or the like.

The thermally-conductive portions 164, 166 can have any suitable thickness. In some embodiments, the thermally-conductive portion 164 of the first surface 163 and/or the thermally-conductive portion 166 of the second surface 165 can have a thickness of less than one millimeter. In other embodiments, the thermally-conductive portion 164 of the first surface 163 and/or the thermally-conductive portion 166 of the second surface 165 can have a thickness of less than 0.1 millimeters. In other embodiments, the thermally-conductive portion 164 of the first surface 163 and/or the thermally-conductive portion 166 of the second surface 165 can have a thickness of less than 0.01 millimeters.

The thermally-conductive portion 164 of the first surface 163 is coupled to the thermally-conductive portion 166 of the second surface 165 by a thermally-conductive via 168. The thermally-conductive via 168 is disposed within the printed circuit board 160 between the first surface 163 and the second surface 165. In this manner, as described below, the thermally-conductive via 168 defines a conductive heat transfer path between the thermally-conductive portion 164 of the first surface 163 and the thermally-conductive portion 166 of the second surface 165. The thermally-conductive via 168 can be constructed from any suitable material, such as for example, a metallic material, a thermally-conductive gel, a phase-change material or the like.

As shown in FIGS. 1 and 2, the thermal interface member 110 is coupled to the first surface 163 of the printed circuit board 160 such that at least a portion of the thermal interface member 110 is in contact with the thermally-conductive portion 164 of the first surface 163. Thus, when the electronic device 180 is coupled to the printed circuit board 160, as shown in FIG. 2, the thermal interface member 110 is disposed between the electronic device 180 and the thermally-conductive portion 164 of the first surface 163 of the printed circuit board 160. Similarly stated, when the electronic device 180 is coupled to the printed circuit board 160, the thermal interface member 110 is in contact with the both the second surface 185 of the electronic device 180 and at least the thermally-conductive portion 164 of the first surface 163 of the printed circuit board 160. In this manner, the electronic device 180 is thermally coupled to the printed circuit board 160 via the thermal interface member 110. The electronic device 180 can be coupled to the printed circuit board 160 in any suitable manner. For example, in some embodiments, the electronic device 180 can be indirectly coupled to the printed circuit board 160 via an electrical connector (not shown in FIGS. 1 and 2). Said another way, the electronic device 180 can be electrically coupled to the printed circuit board 160. In other embodiments, the electronic device 180 can be directly and/or physically coupled to the printed circuit board 160 by a clip, fastener, solder joint, adhesive or the like (not shown in FIGS. 1 and 2).

The thermal interface member 110 is deformable and/or flexible, and thermally-conductive. Thus, when the thermal interface member 110 is disposed between the second surface 185 of the electronic device 180 and the first surface 163 of the printed circuit board 160, as shown in FIG. 2, the thermal interface member 110 can deform to fill in the crevices, spaces and/or voids otherwise between the second surface 185 of the electronic device 180 and the first surface 163 of the printed circuit board 160. In this manner, the thermal interface member 110 can facilitate heat transfer from the electronic device 180 via the printed circuit board 160. More particularly, the thermal interface member 110 defines, at least in part, a heat transfer path between the electronic device 180 and a region 174 adjacent the second surface 165 of the printed circuit board 160. The heat transfer path includes at least a portion of the thermal interface member 110, the thermally-conductive portion 164 of the first surface 163 of the printed circuit board 160, the thermally-conductive via 168 and the thermally-conductive portion 166 of the second surface 165 of the printed circuit board 160. In use, heat can be transferred, by conduction, from the second surface 185 of the electronic device 180 along the heat transfer path, as shown by the arrow AA in FIG. 2. The heat can then be transferred, by convection, from the thermally-conductive portion 166 of the second surface 165 of the printed circuit board 160 to the air within the region 174 adjacent the second surface 165 of the printed circuit board 160, as shown by the arrow BB in FIG. 2. In some embodiments, the data processing unit 100 can include fans and/or air ducts to produce various air flows including an air flow adjacent the second surface 165 of the printed circuit board 160 to facilitate the heat transfer from (i.e., the cooling of) the electronic device 180.

As stated above, the thermal interface member 110 is deformable and/or flexible. Similarly stated, the thermal interface member 110 has a low resistance to deflection, deformation and/or displacement when exposed to an external force. In this manner, the thermal interface member 110 can substantially conform to the shape of the second surface 185 of the electronic device 180 and the first surface 163 of the printed circuit board 160 when disposed between the electronic device 180 and the printed circuit board 160. As described herein, this arrangement allows the thermal interface member 110 to effectively transfer heat between the electronic device 180 and the printed circuit board 160.

The flexibility and/or deformability of the thermal interface member 110 is an extensive property, and thus is dependent upon the properties of the material or materials from which the thermal interface member 110 is constructed and certain physical characteristics of the thermal interface member 110 (e.g., shape). For example, the flexibility and/or deformability of the thermal interface member 110 can be increased when constructed from a material having a low modulus of elasticity. The modulus of elasticity is an intensive property and describes a material's tendency to elastically (i.e., non-permanently) deform in response to an applied force. In another example, the flexibility of the thermal interface member 110 can be increased or decreased by changing the flexural modulus of a material from which the thermal interface member 110 is constructed. The flexural modulus is used to describe the ratio of the applied stress on an object in flexure to the corresponding strain in the outermost portions of the object. The flexural modulus, rather than the modulus of elasticity, is used to characterize certain materials, for example plastics, that do not have material properties that are substantially linear over a range of conditions. For example, an object having a low flexural modulus is more flexible (i.e., is less elastic and has a greater strain on the outermost portions of the object for a given applied force) than an object having a high flexural modulus. Thus, the flexibility of the thermal interface member 110 can be increased by constructing the thermal interface member 110 from a material having a low flexural modulus. In some embodiments the thermal interface member 110 can be constructed from a material having a modulus of elasticity and/or a flexural modulus of less than approximately 750 ksi. In other embodiments the thermal interface member 110 can be constructed from a material having a modulus of elasticity and/or a flexural modulus of less than approximately 400 ksi.

The flexibility and/or deformability of the thermal interface member 110 can also be increased or decreased by changing its shape, cross-sectional area and/or thickness. Although the thermal interface member 110 is shown as being substantially planar and having a substantially constant thickness, in other embodiments, the thermal interface member 110 can have a non-uniform thickness and/or can have an irregular cross-sectional shape (e.g., corrugations or the like) to result in the desired flexibility and/or deformability.

The thermal interface member 110 can be constructed from any suitable material or materials. For example, in some embodiments, the thermal interface member 110 can include a thermally-conductive gel, a thermally-conductive grease and/or a phase-change material. For example, in some embodiments, the thermal interface member 110 can include a thermally-conductive gel having a thermal conductivity of at least 1 W/m-K. In other embodiments, the thermal interface member 110 can include a thermally-conductive gel having a thermal conductivity of at least 3 W/m-K. In other embodiments, the thermal interface member 110 can include a thermally-conductive gel having a thermal conductivity of at least 7 W/m-K. Such thermally-conductive gels can include silicone-based gels, gels including boron-nitride or the like. For example, in some embodiments the thermal interface member 110 can include the SE series of conductive gels produced by Dow Corning.

In some embodiments, the thermal interface member 110 can include a phase-change material configured to change phase above a predetermined temperature. Such materials can be formulated to be substantially solid when below an operating temperature of the electronic device 180, and substantially flowable, deformable and/or compressible when above the operating temperature. This arrangement allows the thermal interface member 110 to deform to fill in the crevices, spaces and/or voids between the second surface 185 of the electronic device 180 and the thermally-conductive portion 164 of the first surface 163 of the printed circuit board 160 when the temperature of the thermal interface member 110 is above the operating temperature of the electronic device 180. In this manner, the thermal interface member 110 can enhance the heat transfer between the electronic device 180 and the printed circuit board 160. In some embodiments, the thermal interface member 110 can be formulated to change phase at a temperature above approximately 40 degrees Celsius. In some embodiments, the thermal interface member 110 can include the THERMFLOW® 700 series of phase-change materials produced by Chomerics, a division of Parker Hannifin Corporation. In other embodiments, the thermal interface member 110 can include the SARCON® line of thermal interface materials produced by Fujipoly America Corporation.

Figure 3:
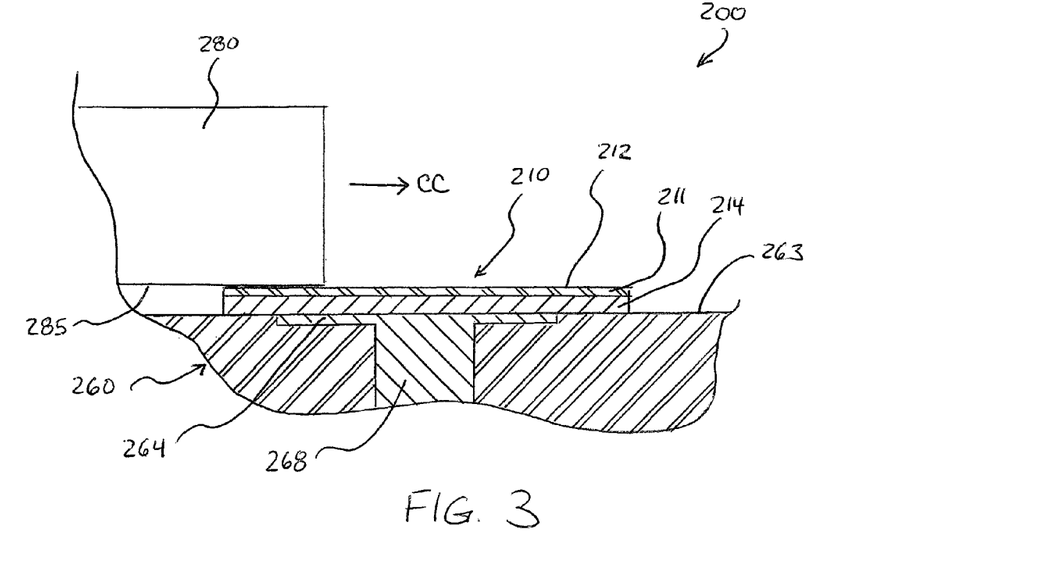
FIG. 3 is a cross-sectional side view of a portion of a data processing unit having a thermal interface member according to an embodiment.

In some embodiments, the thermal interface member 110 can be configured and/or formulated to be in sliding contact with the electronic device 180. Similarly stated, in some embodiments an outer surface of the thermal interface member 110 can be formulated to be tear resistant and/or have a low coefficient of friction to facilitate sliding contact between the thermal interface member 110 and the electronic device 180. In some embodiments, for example, a thermal interface member can include one or more layers and/or strata constructed from one or more different materials arranged such that the thermal interface member is thermally-conductive, deformable, flexible, tear resistant and/or has a low coefficient of friction. For example, FIG. 3 is a cross-sectional view of a portion of a data processing unit 200 having a thermal interface member 210 according to an embodiment. The data processing unit 200 includes a printed circuit board 260, an electronic device 280 and the thermal interface member 210. The electronic device 280 can be any suitable electronic device configured to perform, at least in part, the functions of the data processing unit 200. The electronic device 280 can be removably coupled to the data processing unit 200 and/or the printed circuit board 260, by sliding the electronic device 280 along the surface 263 of the printed circuit board 260 and/or the thermal interface member 210 and into contact with an electrical connector (not shown), as shown by the arrow CC in FIG. 3.

The printed circuit board 260 is similar to the printed circuit board 160 shown and described above, and is therefore not described in detail herein. The printed circuit board 260 includes the first surface 263 and a second surface (not shown in FIG. 3). The first surface 263 of printed circuit board 260 includes a thermally-conductive portion 264 that is coupled to the second surface of the printed circuit board 260 by a thermally-conductive via 268. In this manner, as described herein, the thermally-conductive via 268 defines at least a portion of a conductive heat transfer path to facilitate cooling of the electronic device 280.

The thermal interface member 210 includes a first layer or stratum 211 and a second layer or stratum 214. The first layer 211 can be constructed from any suitable material of the types shown and described herein that is tear-resistant, puncture-resistant, abrasion-resistant and/or thermally-conductive. In some embodiments, for example, the first layer 211 can be constructed from a material having a thermal conductivity of at least approximately 0.07 W/m-K and a Graves tear resistance value of at least one pound. In other embodiments, the first layer 211 can be constructed from a material having an Elmendorf tear strength, which is a measure of the force to propagate an existing slit a fixed distance to the edge of a test sample, of at least 0.07 pounds. The inclusion of a first layer that is tear-resistant, puncture-resistant and/or abrasion-resistant can limit damage to the thermal interface member 210 by removal and/or coupling of the electronic device 280 to the printed circuit board 260.

Moreover, in some embodiments, an outer surface 212 of the first layer 211 can be configured to be in sliding contact with the electronic device 280 to further facilitate removal and/or coupling of the electronic device 280 to the printed circuit board 260. For example, in some embodiments, the outer surface 212 of the first layer 211 can have a low coefficient of static friction and/or a low coefficient of kinetic friction to facilitate sliding contact between the thermal interface member 210 and the electronic device 280. For example, in some embodiments, the outer surface 212 of the first layer 211 can have a static coefficient of friction of less than approximately 0.5. In other embodiments, the outer surface 212 of the first layer 211 can have a static coefficient of friction of less than approximately 0.1. In some embodiments, the first layer 211 can be constructed from a material having a high lubricity, which can be beneficial when the electronic device 280 is moved relative to the printed circuit board 260. The lubricity of the outer surface 212 can also improve the tear resistance of the first layer 211 by allowing the outer surface 212 to slide smoothly relative to the electronic device 280.

In some embodiments, the first layer 211 can be flexible and/or deformable, as described above. In this manner, the first layer 211 of the thermal interface member 210 can substantially conform to the shape of the electronic device 280. As described herein, this arrangement allows the thermal interface member 210 to effectively transfer heat between the electronic device 280 and the printed circuit board 260. As described above, the flexibility of the first layer 211 can also be increased or decreased by changing the shape, cross-sectional area and/or thickness of the first layer 211. Although the first layer 211 is shown as being substantially planar and having a substantially constant thickness, in other embodiments, the first layer 211 can have a non-uniform thickness and/or can have an irregular cross-sectional shape (e.g., corrugations or the like) to result in the desired flexibility. Additionally, to increase the flexibility and/or enhance the thermal conduction through the first layer 211, the first layer 211 can be thin. In some embodiments, for example, the first layer 211 can have a thickness of approximately 23 microns (0.0005 inches) or less. In other embodiments, the first layer 211 can have a thickness of approximately 25 microns (0.001 inches) or less.

In some embodiments, the first layer 211 can be constructed from a metalized polymer, such as a metalized polyester film, a metalized polyimide film, or the like. Such metalized polymers can include, for example, aluminized Mylar®, Kapton® or the like. In other embodiments, the first layer 211 can be a reinforced metal foil that includes, for example, a metal foil reinforced with glass fibers, graphite fibers, or the like. Such materials can provide the thermal properties (e.g., thermal conductivity) and the mechanical properties (e.g., toughness, tear resistance, coefficient of friction) desired for the thermal interface member 210.

The second layer or stratum 214 is constructed from a material that is deformable and thermally-conductive. Thus, when the thermal interface member 210 is disposed between a surface 285 of the electronic device 280 and the thermally-conductive portion 264 of the first surface 263 of printed circuit board 260, the second layer 214 can deform to fill in the crevices, spaces and/or voids between the surface 285 of the electronic device 280 and the first surface 263 of printed circuit board 260. In this manner, the thermal interface member 210 can enhance the heat transfer between the electronic device 280 and the printed circuit board 260.

In some embodiments, the second layer 214 can be constructed from a thermally-conductive gel, a thermally-conductive grease and/or a phase-change material, of the types described herein. In other embodiments, the second layer 214 can be constructed from a phase-change material of the types described herein.

Figure 4:
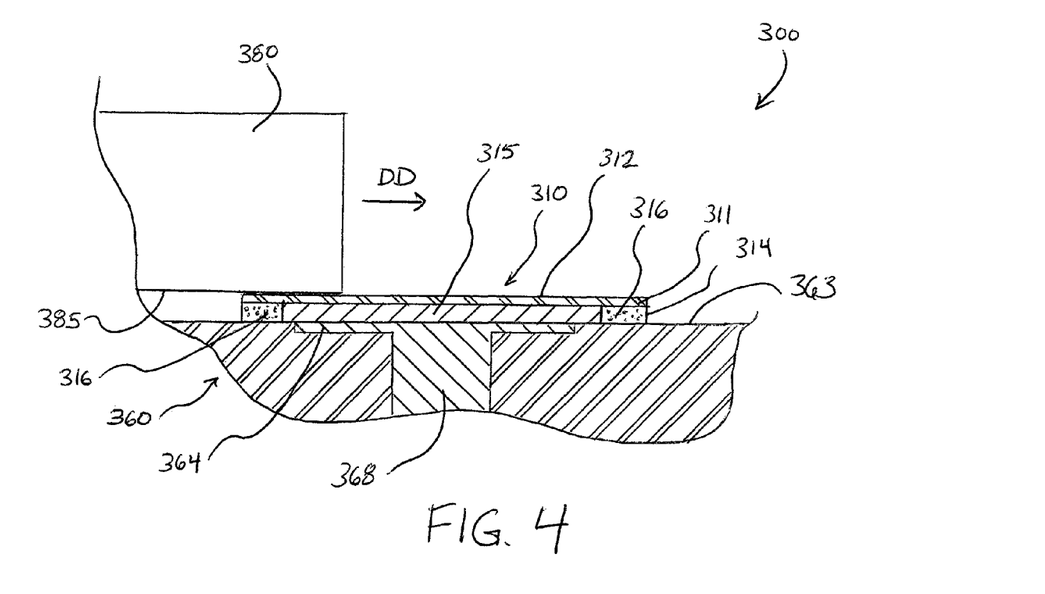
FIG. 4 is a cross-sectional side view of a portion of a data processing unit having a thermal interface member according to an embodiment.

Although the thermal interface member 210 is shown as including a second layer 214 that is substantially homogeneous, in other embodiments, a thermal interface member can include a second layer that is non-homogeneous and/or that is constructed from multiple different materials. For example, FIG. 4 is a cross-sectional view of a portion of a data processing unit 300 having a thermal interface member 310 according to an embodiment. The data processing unit 300 includes a printed circuit board 360, an electronic device 380 and the thermal interface member 310. The electronic device 380 can be any suitable electronic device configured to perform, at least in part, the functions of the data processing unit 300. The electronic device 380 can be removably coupled to the data processing unit 300 and/or the printed circuit board 360, by sliding the electronic device 380 along the surface 363 of the printed circuit board 360 and/or the thermal interface member 310 and into contact with an electrical connector (not shown), as shown by the arrow DD in FIG. 4.

The printed circuit board 360 is similar to the printed circuit boards 160 and 260 shown and described above, and is therefore not described in detail herein. The printed circuit board 360 includes the first surface 363 and a second surface (not shown in FIG. 3). The first surface 363 of printed circuit board 360 includes a thermally-conductive portion 364 that is coupled to the second surface of the printed circuit board 360 by a thermally-conductive via 368. In this manner, as described herein, the thermally-conductive via 368 defines at least a portion of a conductive heat transfer path to facilitate cooling of the electronic device 380.

The thermal interface member 310 includes a first layer or stratum 311 and a second layer or stratum 314. The first layer 311 is similar to the first layer 211 shown and described above, and is therefore not discussed in detail herein. The first layer 311 can be constructed from any suitable material of the types shown and described herein that is tear-resistant, puncture-resistant, abrasion-resistant and/or thermally-conductive. Moreover, in some embodiments, an outer surface 312 of the first layer 311 can be formulated and/or configured to be in sliding contact with the electronic device 380 to further facilitate removal and/or coupling of the electronic device 380 to the printed circuit board 360.

The second layer 314 of the thermal interface member 310 includes a first region 315 and a second region 316. The first region 315 is constructed from a material that is deformable and thermally-conductive, of the types described herein. Thus, when the thermal interface member 310 is disposed between a surface 385 of the electronic device 380 and the thermally-conductive portion 364 of the first surface 363 of printed circuit board 360, the first region 315 of the second layer 314 can deform to fill in the crevices, spaces and/or voids between the surface 385 of the electronic device 380 and the first surface 363 of printed circuit board 360.

The second region 316 includes an adhesive suitable for coupling, bonding and/or attaching the thermal interface member 310 to the printed circuit board 360. In some embodiments, the adhesive can include a mixture and/or combination of materials. In some embodiments, the adhesive can include a pressure-sensitive adhesive. Moreover, in some embodiments, the first region 315 can be devoid of the adhesive. Similarly stated, in some embodiments, the first region 315 is mutually exclusive from the second region 316. This arrangement allows the primary heat conduction path (i.e., the first region 315 of the second layer 314) to be devoid of adhesives and/or other coupling mechanisms, which could otherwise impede the heat transfer between the electronic device 380 and the printed circuit board 360.

FIGS. 5-8 show a portion of a data processing unit 400 according to an embodiment. The data processing unit 400 includes a printed circuit board 460 having a thermal interface member 410, an optical transceiver 480 and a mounting cage 440. The printed circuit board 460 includes a first (or top) surface 463 and a second (or bottom) surface 465 (shown in FIG. 8). The printed circuit board 410 defines a set of lumens 469 that is used to couple the mounting cage 440 to the printed circuit board 460, as described in more detail below. The printed circuit board 460 also includes electronic circuitry (e.g., modules, connectors, and the like, which are not shown in FIGS. 5-8), in addition to the optical transceiver 480, that is configured to perform, at least in part, the functions of the data processing unit 400. The first surface 463 of the printed circuit board 460 includes an electrical connector 470 that can electronically couple the optical transceiver 480 to the printed circuit board 460 and/or the electronic circuitry of the printed circuit board 460. Additionally, the printed circuit board 460 can include any number of electrically conductive layers to facilitate electrically coupling the optical transceiver 480 and the electronic circuitry of the printed circuit board 460.

Figure 5:
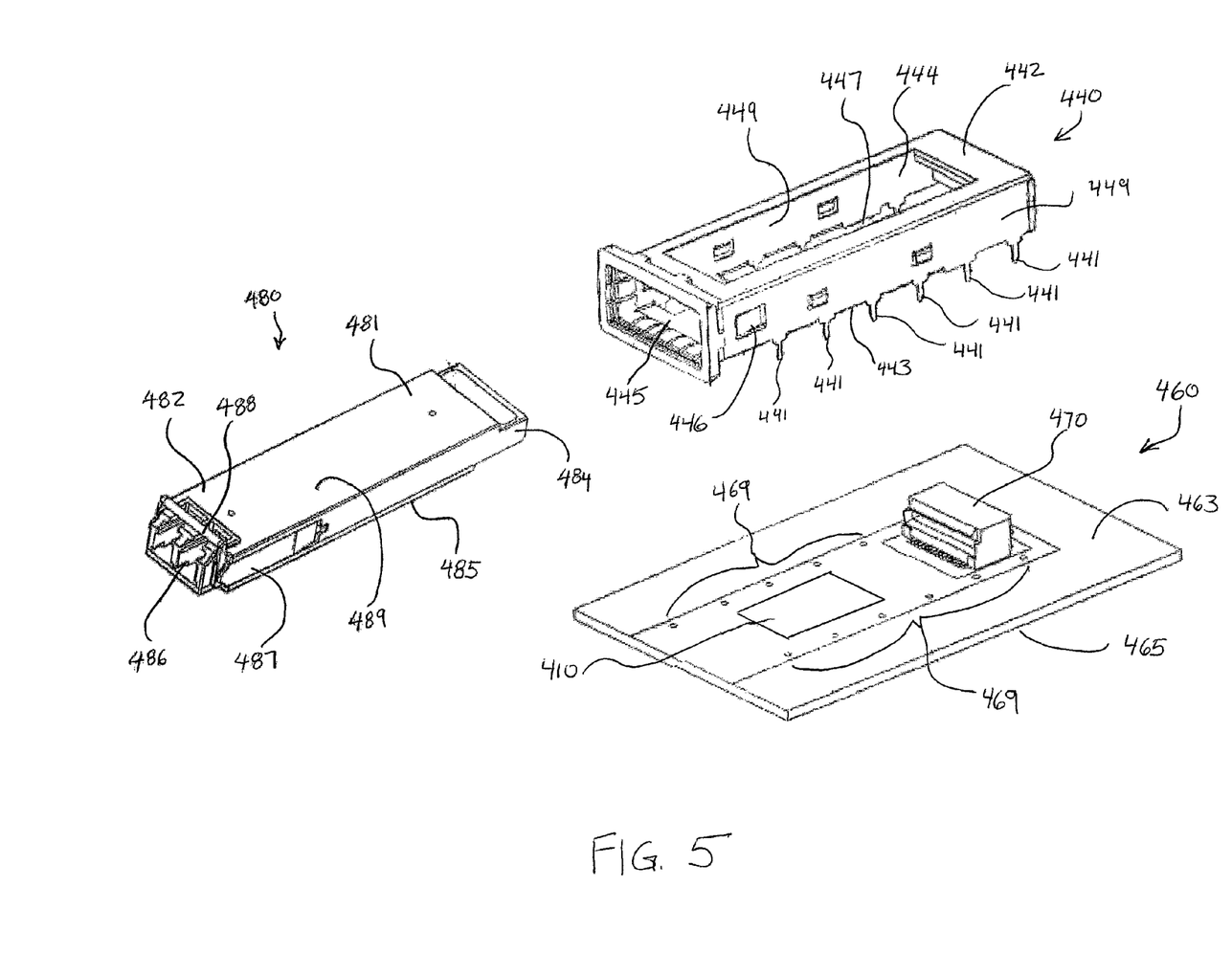
FIG. 5 is an exploded perspective view of a portion of a data processing unit having a thermal interface member according to an embodiment.

The optical transceiver 480 can be any pluggable optical transceiver manufactured according to the SFP standard or any other Multi-Source Agreement (MSA) standard, including, for example, the Quad Small Form factor Pluggable (QSFP) standard, the CXP standard, the XFP standard, or the like. The optical transceiver 480 has a first end portion 481 and a second end portion 482. The first end portion 481, which is configured to be first inserted into the mounting cage 440, includes a connector 484 configured to matingly engage the electrical connector 470 of the printed circuit board 460.

The second end portion 482 of the optical transceiver 480 includes an input/output connector 486, a locking mechanism 487 and an actuator 488 configured to actuate the locking mechanism 487. The locking mechanism 487 is configured to matingly engage a corresponding structure in the mounting cage 440 to selectively maintain the optical transceiver 480 within the mounting cage 440. The actuator 488 can actuate and/or release the locking mechanism 487 to facilitate insertion and/or removal of the optical transceiver 480 from the mounting cage 440.

Figure 6:
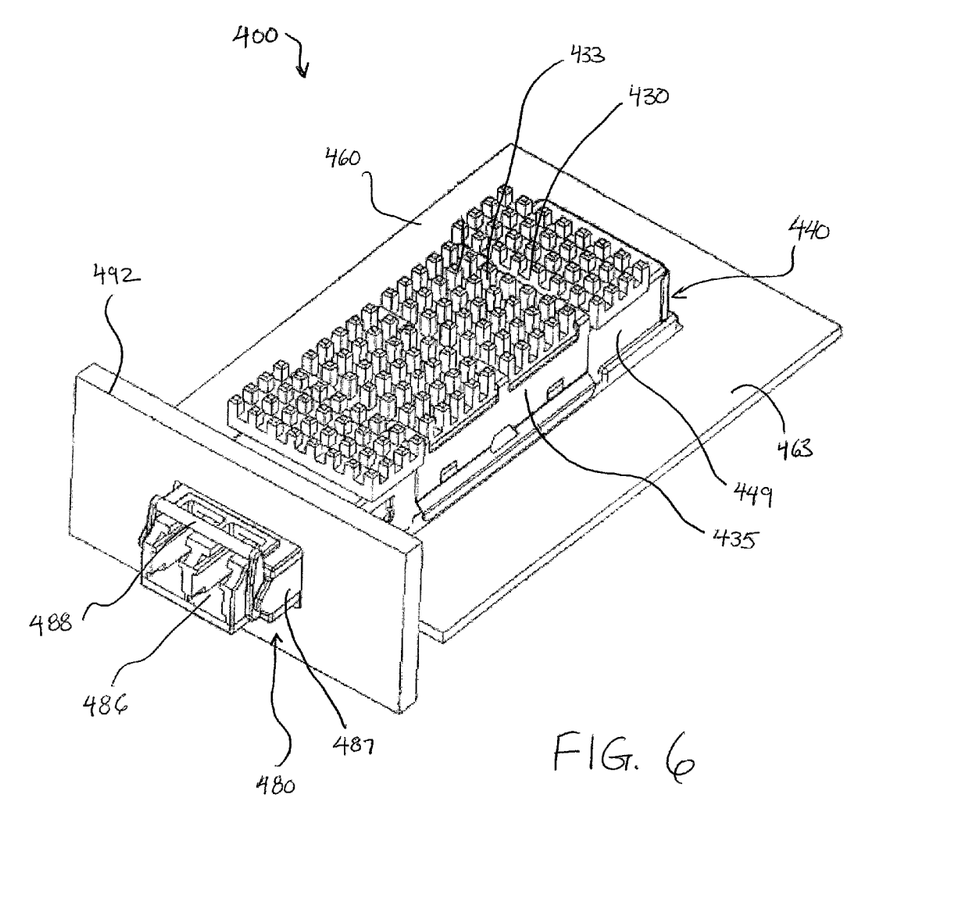
FIG. 6 is a perspective view of the portion of the data processing unit shown in FIG. 5.
Figure 7:
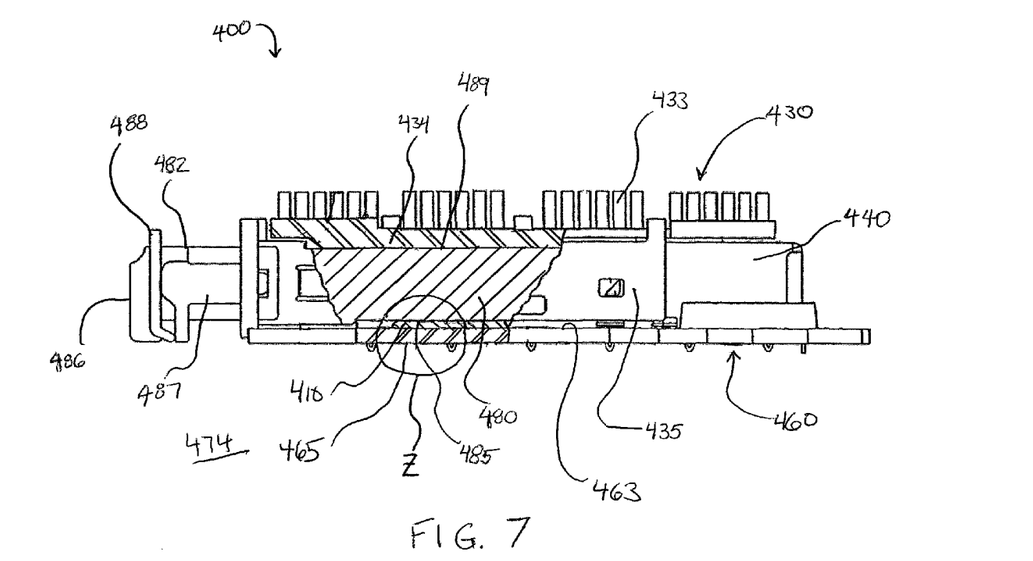
FIG. 7 is a side view and partial cross-sectional view of the portion of the data processing unit shown in FIG. 6.

The optical transceiver 480 includes a first (or top) surface 489 and a second (or bottom) surface 485. When the optical transceiver 480 is installed within the mounting cage 440, the first surface 489 is adjacent a first opening 444 (i.e., a top opening) defined by the mounting cage 440, and the second surface 485 is adjacent a second opening 447 (i.e., a bottom opening) defined by the mounting cage 440. In this manner, when the optical transceiver 480 is installed within the mounting cage 440, a portion of a heat sink 430 (see FIGS. 6 and 7) can extend through the top opening 444 of the mounting cage 440 to contact the first (or top) surface 489 of the optical transceiver 480 to facilitate heat transfer from the top portion of the optical transceiver 480. The heat sink 430 is shown in FIGS. 6 and 7, but is not shown in FIG. 5 so that the features of the mounting cage 440 can be clearly shown and identified. Moreover, as described in more detail below, the second surface 485 is in contact with the thermal interface member 410, a portion of which is disposed within the bottom opening 447 of the mounting cage 440, to facilitate heat transfer from the bottom portion of the optical transceiver 480.

The mounting cage 440 includes a first (or top) side wall 442 and two side portions 449. The top side wall 442 defines the opening 444. The side portions 449 include a series of mounting protrusions 441, each of which can be disposed within a corresponding lumen 469 from the set of lumens 469 to couple the mounting cage 440 to the printed circuit board 460. Similarly stated, when the mounting cage 440 is coupled to the printed circuit board 460, the set of lumens 469 and the set of mounting protrusions 441 collectively limit the movement of the mounting cage 440 relative to the printed circuit board 460. In some embodiments, for example, the mounting protrusions 441 can be sized to produce an interference fit within the corresponding lumen from the set of lumens 469.

The mounting cage 440 also defines a front opening 445, through which the optical transceiver 480 is disposed when the optical transceiver 480 is installed into the mounting cage 440 and/or coupled to the printed circuit board 460. The side portions 449 include locking mechanisms 446 that engage the locking mechanism 487 of the optical transceiver 480 to selectively maintain the optical transceiver 480 within the mounting cage 440.

When the mounting cage 440 is coupled to the printed circuit board 460, the mounting cage 440 and a portion of the first surface 463 of the printed circuit board 460 define an internal volume (not identified in FIGS. 5-8) within which at least a portion of the optical transceiver 480 can be disposed. Similarly stated, the mounting cage 440 and a portion of the first surface 463 of the printed circuit board 460 define an internal volume and an external volume that is outside of the internal volume. The external volume includes any volume external to the internal volume, including, for example the volume 474 that is adjacent the second surface 465 of the printed circuit board 460, as identified in FIGS. 7 and 8.

When the optical transceiver 480 is installed within the mounting cage 440, a portion of the heat sink 430 (see FIGS. 6 and 7) can extend through the top opening 444 of the mounting cage 440 into contact with the top surface 489 of the optical transceiver 480 to facilitate heat transfer from the top portion of the optical transceiver 480. More particularly, the heat sink 430 includes a convection portion 433 and an engagement portion 434. The convection portion 433 includes a series of protrusions or fins to provide an increased surface area to enhance the transfer of heat between the convection portion 433 and the cooling medium (e.g., air). The engagement portion 434 is configured to be disposed within the top opening 444 (see FIG. 7) to contact the top surface 489 of the optical transceiver 480. Moreover, a spring 435 is coupled to the mounting cage 440 and the heat sink 430 to urge the heat sink 430 downward relative to the mounting cage 440. Similarly stated, the spring 435 biases the heat sink 430 against the mounting cage 440 such that the engagement portion 434 of the heat sink 430 is at least partially disposed within the top opening 444 of the mounting cage 440 to ensure that the engagement portion 434 is in contact with the top surface 489 of the optical transceiver 480 when the optical transceiver 480 is disposed within the mounting cage 440. In this manner, a conductive heat transfer path can be formed between the heat sink 430 and the optical transceiver 480. Thus, the heat sink 430 is a dynamically adjustable or "riding" heat sink that can accommodate the insertion and/or removal of the optical transceiver 480.

Figure 8:
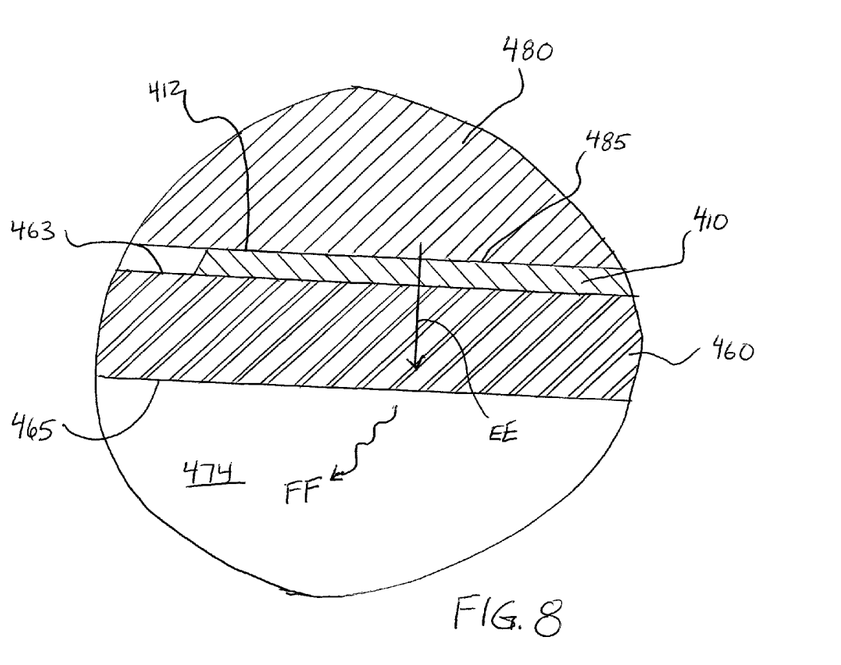
FIG. 8 is a cross-sectional view of the portion of the printed circuit board, thermal interface member and optical transceiver shown FIG. 7, taken along region Z in FIG. 7.

As shown in FIGS. 5, 7 and 8, the thermal interface member 410 is coupled to the first surface 463 of the printed circuit board 460 such that at least a portion of the thermal interface member 410 is disposed within the bottom opening 447 of the mounting cage 440. In this manner, when the optical transceiver 480 is installed within the mounting cage 440, the second surface 485 of the optical transceiver 480 is in contact with the thermal interface member 410, to facilitate heat transfer from the bottom portion of the optical transceiver 480. More particularly, as shown in FIG. 8, heat can be transferred from the bottom surface 485 of the optical transceiver 480, by conduction, along the heat transfer path, as shown by the arrow EE in FIG. 8. The heat can then be transferred, by convection, from the second surface 465 of the printed circuit board 460 to the air within the exterior region 474 adjacent the second surface 465 of the printed circuit board 460, as shown by the arrow FF in FIG. 8.

The thermal interface member 410 can be any suitable thermal interface member of the types shown and described herein. For example, the thermal interface member 410 can be deformable and thermally-conductive. Additionally, the thermal interface member 410 can include a surface that is tear-resistant, puncture-resistant, abrasion-resistant and/or thermally-conductive. Similarly stated, in some embodiments, an outer surface of the thermal interface member 410 can be formulated and/or configured to be in sliding contact with the optical transceiver 480 to further facilitate removal and/or coupling of the optical transceiver 480 to the printed circuit board 460.

Figure 9:
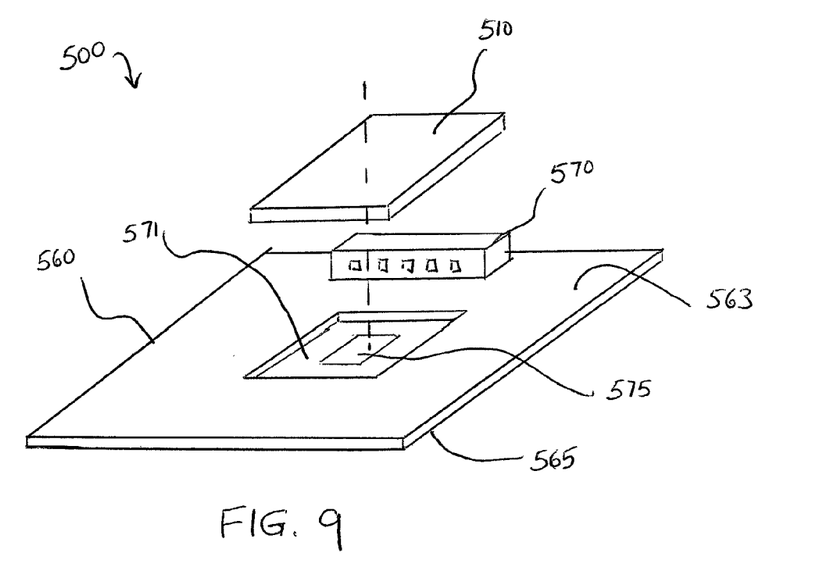
FIG. 9 is an exploded perspective view of a printed circuit board and a thermal interface member according to an embodiment.
Figure 10:
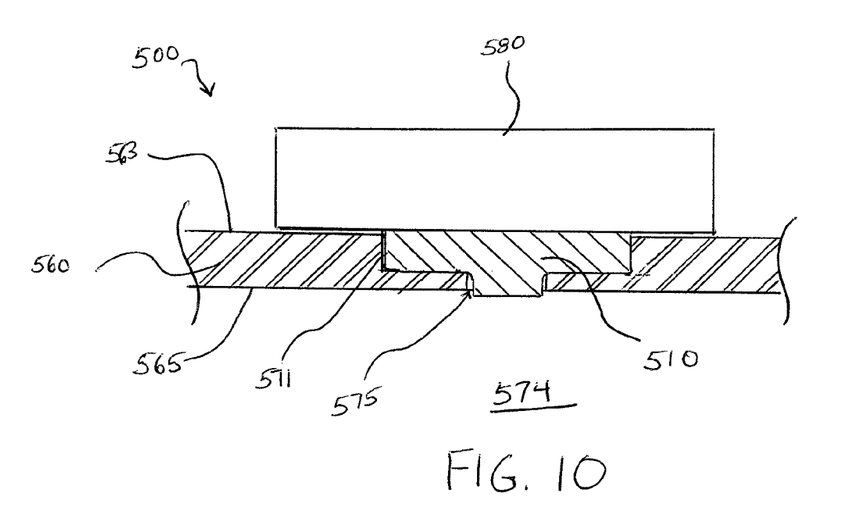
FIG. 10 is a cross-sectional view of the portion of the printed circuit board and thermal interface member shown in FIG. 9.

FIGS. 9 and 10 show an exploded view and a cross-sectional view, respectively, of a portion of a data processing unit 500 having a printed circuit board 560 and a thermal interface member 510 according to an embodiment. The data processing unit 500 can be any suitable data processing unit of the types shown and described herein, and includes the printed circuit board 560, an electronic device 580 (shown in FIG. 10, but not shown in FIG. 9) and the thermal interface member 510. The thermal interface member 510 can be any thermal interface member of the types shown and described herein. The electronic device 580 can be any suitable electronic device configured to perform, at least in part, the functions of the data processing unit 500. The electronic device 580 can be removably coupled to the data processing unit 500 and/or the printed circuit board 560, by sliding the electronic device 580 along the first (or top) surface 563 of the printed circuit board 560 and into contact with the electrical connector 570.

The printed circuit board 560 includes the first surface 563 and a second surface 565. The printed circuit board 560 includes a series of conductive layers (not shown in FIGS. 9 an 10) that define a series of electrical paths through which the electronic device 580 and other electronic components (not shown) can be coupled. In this manner, the printed circuit board 560, the electronic device 580 and other electronic components (e.g., modules, connectors, and the like, which are not shown in FIGS. 9 and 10) can collectively perform, at least in part, the functions of the data processing unit 500.

The printed circuit board 560 defines a recess 571 within which at least a portion of the thermal interface member 510 can be disposed. This arrangement allows the thermal interface member 510 to be coupled to the printed circuit board 560 in a predetermined location to ensure that at least a portion of the electronic device 580 will be in contact with the thermal interface member 510 when the electronic device 580 is removably coupled to the printed circuit board 560. The recess 571, which can also be referred to as an opening or cavity, also provides a volume within which a portion of the thermal interface member 510 can be deformed and/or compressed when the electronic device 580 is in contact and/or exerts a force onto the thermal interface member 510.

As shown in FIGS. 9 and 10, the second surface 565 of the printed circuit board 560 defines an opening 575 within which a portion of the thermal interface member 510 can be disposed when the electronic device 580 is in contact and/or exerts a force onto the thermal interface member 510. The printed circuit board 560 includes a shoulder within the recess 571 against which a portion of the thermal interface member 510 can be disposed when the electronic device 580 is in contact and/or exerts a force onto the thermal interface member 510. In this manner, the thermal interface member 510 can be retained within the recess 571 while a portion of the thermal interface member 510 is disposed within and/or extends through the opening 575. Moreover, because the thermal interface member 510 is disposed, at least in part, within the printed circuit board 560 between the first surface 563 and the second surface 565, the thermal interface member 510 defines a conductive heat transfer path between electronic device 580 and a region 574 adjacent the second surface 565 of the printed circuit board 560.

In some embodiments, the thermal interface member 510 can have a shape corresponding to the shape of the recess 571. In other embodiments, the thermal interface member 510 can be constructed from a deformable material such that the thermal interface member 510 can be deformed to substantially correspond to the shape of the recess 571 and/or extend through the opening 575 when the electronic device 580 is in contact and/or exerts a force onto the thermal interface member 510. Although the recess 571 and the thermal interface member 510 are shown as being substantially rectangular, in other embodiments, the recess 571 and/or the thermal interface member 510 can have any suitable shape. Although the thermal interface member 510 is shown as having substantially the same size as the recess 571, in other embodiments, the thermal interface member 510 can be larger or smaller than the recess 571.

Figure 11:
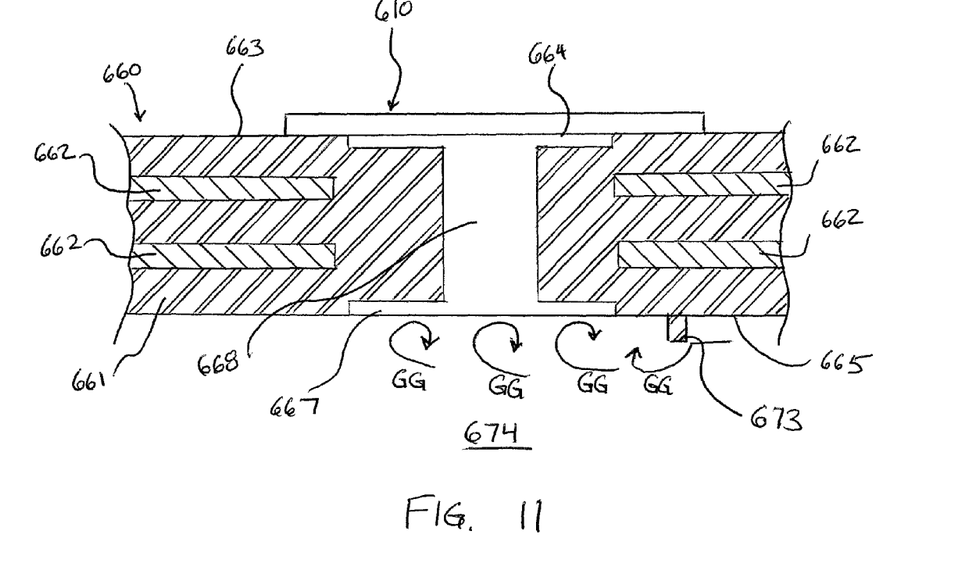
FIG. 11 is a cross-sectional side view of a portion of a printed circuit board according to an embodiment taken along line $X_1$-$X_1$ in FIG. 12.
Figure 12:
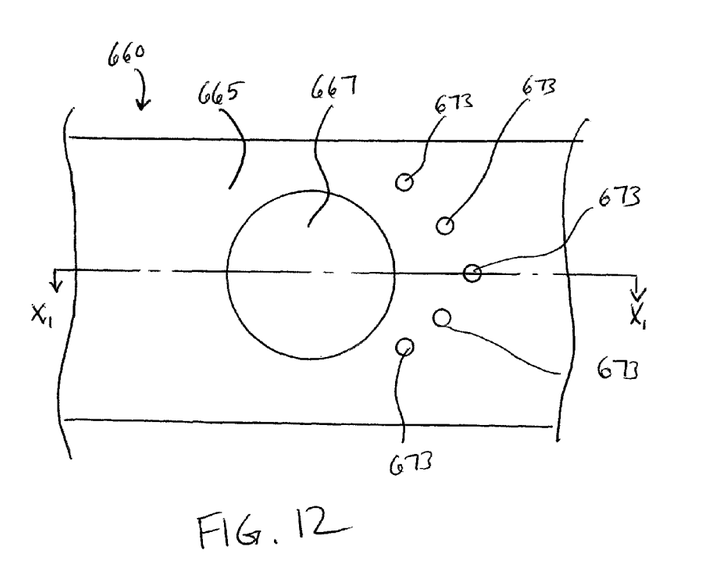
FIG. 12 is a bottom view of the portion of the printed circuit board shown in FIG. 11.

In some embodiments, a surface of a printed circuit board can include a series of recesses, protrusions and/or a structure to influence the air flow adjacent the surface of the printed circuit board and/or enhance the convection heat transfer from the surface of the printed circuit board to the surrounding region. For example, FIGS. 11 and 12 show a cross-sectional view and a bottom view, respectively, of a printed circuit board 660 according to an embodiment. As shown in FIG. 11, the printed circuit board 660 can include a thermal interface member 610 of the types shown and described herein to facilitate heat transfer from an electronic device (not shown in FIGS. 11 and 12). The printed circuit board 660 includes a first surface 663 and a second surface 665. The printed circuit board 660 includes a series of conductive layers 662 surrounded and/or separated by an insulating material 661 in a similar fashion as the printed circuit board 160 shown and described above. The conductive layers 662 define a series of electrical paths through which the electronic components (not shown) can be coupled. In this manner, the printed circuit board 660 and the electronic components can collectively perform, at least in part, the desired functions.

The first surface 663 of printed circuit board 660 includes a thermally-conductive portion 664, and the second surface 665 of printed circuit board 660 includes a thermally-conductive portion 667. In some embodiments, the thermally-conductive portion 664 of the first surface 663 and/or the thermally-conductive portion 667 of the second surface 665 can be a copper foil layer disposed on a portion of the first surface 663 and/or the second surface 665, respectively. The thermally-conductive portion 664 of the first surface 663 is coupled to the thermally-conductive portion 667 of the second surface 665 by a thermally-conductive via 668. The thermally-conductive via 668 is disposed within the printed circuit board 660 between the first surface 663 and the second surface 665. In this manner, the thermally-conductive via 668 defines a conductive heat transfer path between the thermally-conductive portion 664 of the first surface 663 and the thermally-conductive portion 667 of the second surface 665.

As shown in FIG. 11, the thermal interface member 610 is coupled to the first surface 663 of the printed circuit board 660 such that at least a portion of the thermal interface member 610 is in contact with the thermally-conductive portion 664 of the first surface 663. Thus, when an electronic device is coupled to the printed circuit board 660, the thermal interface member 610 is disposed between the electronic device and the thermally-conductive portion 664 of the first surface 663 of the printed circuit board 660, as described above. In this manner, the thermal interface member 610 and the thermally-conductive via 668 collectively define at least a portion of a conductive heat transfer path to facilitate cooling of the electronic device.

In use, the data processing unit can include a fan or other air mover to produce an various air flows including an air flow adjacent the second surface 665 of the printed circuit board 660 to promote convection heat transfer from the thermally-conductive portion 667 to the region 674 adjacent the second surface 665. As shown in FIGS. 11 and 12, the second surface 665 of the printed circuit board 660 includes a set of protrusions 673 adjacent and/or disposed on the thermally-conductive portion 667 of the second surface 665. The protrusions 673 can produce turbulence and/or unsteady flow patterns in the air flow adjacent the second side 665 of the printed circuit board 660, as shown by the arrows GG in FIG. 11. Similarly stated, the protrusions 673 can define flow obstructions configured to guide and/or direct air flow onto the thermally-conductive portion 667 to promote heat transfer.

The protrusions 673 can be of any suitable size and/or shape to produce the desired air flow pattern. Moreover, in some embodiments, the protrusions 673 can be integrally formed with the printed circuit board 660 (e.g., by etching). In other embodiments, the protrusions 673 can be produced separately from the printed circuit board 660 and then coupled or attached to the printed circuit board 660. In some embodiments, for example, the protrusions 673 can be pins that are press fit into corresponding openings defined by the second surface 665 of the printed circuit board 660.

Although shown as including a set of protrusions 673, in other embodiments, the second surface 665 of the printed circuit board 660 can include a single protrusion. In yet other embodiments, the second surface 665 of the printed circuit board 660 can define one or more recesses to produce turbulence and/or unsteady flow patterns. In still other embodiments, a flow member (not shown in FIGS. 11 and 12) can be coupled to the second surface 665 of the printed circuit board 660 adjacent the thermally-conductive portion 667. Such a flow member can, for example, be configured (e.g., shaped) to produce a desired flow adjacent the thermally-conductive portion 667. In some embodiments, for example, a flow member can be configured to produce a rotational motion (e.g., a swirl) in the air flow adjacent the thermally-conductive portion 667.

Figure 13:
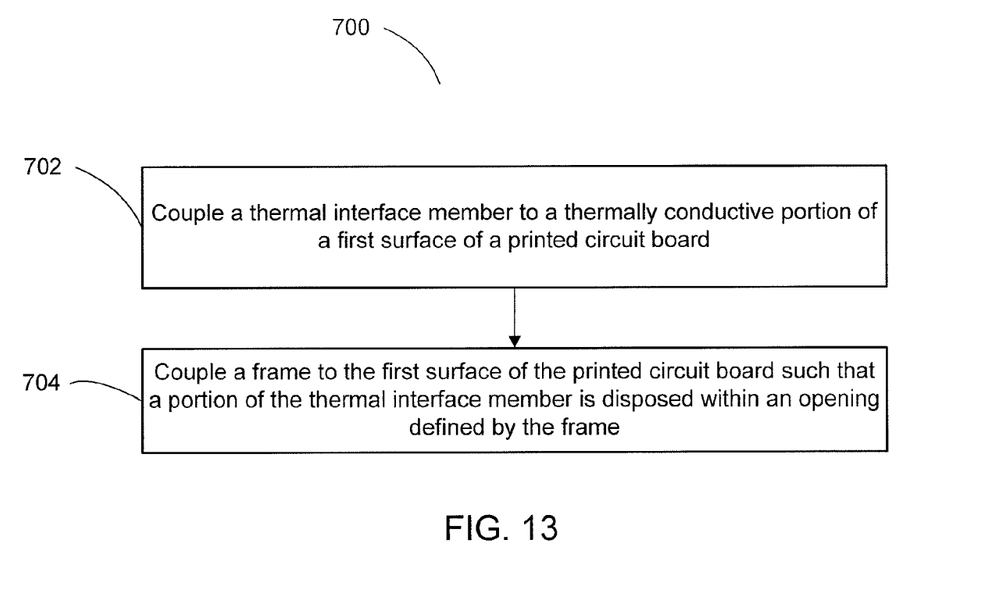
FIG. 13 is a flow chart of a method of assembling a portion of a data processing unit according to an embodiment.

FIG. 13 is a flow chart of a method 700 according to an embodiment. The method includes coupling a thermal interface member to a thermally-conductive portion of a first surface of a printed circuit board, 702. The printed circuit board, which can be any of the printed circuit boards shown and described herein, includes a second surface having a thermally-conductive portion that is coupled to the thermally-conductive portion of the first surface by a thermally-conductive via between the first surface and the second surface. The thermal interface member can be any of the thermal interface members shown and described herein.

In some embodiments, the thermal interface member can be coupled to the first surface of the printed circuit board by disposing a first portion of the thermal interface member against the first surface of the printed circuit board, and coupling a second portion of the thermal interface member to the first surface of the printed circuit board via an adhesive. In such embodiments, the thermal interface member can include a layer having regions constructed from an adhesive, similar to the thermal interface member 310 described above with reference to FIG. 4.

A frame is coupled to the first surface of the printed circuit board such that a portion of the thermal interface member is disposed within an opening defined by the frame, at 704. The frame defines at least in part, an internal volume within which at least a portion of an electronic device can be removably disposed. The frame can be, for example, a mounting and/or EMI shielding cage, such as the mounting cage 440 shown and described above.

While various embodiments have been described above, it should be understood that they have been presented by way of example only, and not limitation. Where methods and/or schematics described above indicate certain events and/or flow patterns occurring in certain order, the ordering of certain events and/or flow patterns may be modified. While the embodiments have been particularly shown and described, it will be understood that various changes in form and details may be made.

For example, although the thermally-conductive portions 164 of the first surface 163 and the thermally-conductive portion 166 of the second surface 165 are shown as having an outer surface that is substantially flush with the first surface 163 and the second surface 165 of the printed circuit board 160, respectively, in other embodiments, thermally-conductive portion 164 of the first surface 163 and/or the thermally-conductive portion 166 of the second surface 165 can protrude from the first surface 163 and/or the second surface 165, respectively. In yet other embodiments, the thermally-conductive portion 164 of the first surface 163 and/or the thermally-conductive portion 166 of the second surface 165 can be recessed within the first surface 163 and/or the second surface 165, respectively.

Although the thermal interface member 310 is shown as having a second layer with two distinct regions (i.e., region 315 and region 316), in other embodiments, a thermal interface member can include any number of layers having any number of distinct regions formed from any number of different materials. In such embodiments, for example, each region and/or different material can be configured to be disposed adjacent a particular portion of a printed circuit board and/or an electronic device.

Although the thermal interface member 210 is shown and described herein as including two layers, in other embodiments, a thermal interface member can include any number of layers. For example, in some embodiments, a thermal interface member can include a third layer that is disposed about at least a portion an adhesive region and/or a thermally-conductive region. The third layer can be removably coupled to the adhesive portions and serve as a removable protective layer to prevent damage to the adhesive region and/or the thermally-conductive region.

Although the first region 315 of the thermal interface member 310 is shown as being mutually exclusive and/or distinct from the second region 316, in other embodiments, a first region and the second region of a thermal interface member can overlap and/or share a common portion. Although the first region 315 and the second region 316 are shown as being contiguous and/or sharing, at least in part, a common boundary, in other embodiments, a first region and the second region of a thermal interface member can be non-contiguous.

Although the thermal interface members are shown and described above as having mutually exclusive layers, in other embodiments, a thermal interface member can include multiple different materials that are not separated in discrete layers and or strata.

Although the optical transceivers are described herein as being manufactured according to the SFP standard, in other embodiments, an optical transceiver assembly can include any optical transceiver manufactured according to any Multi-Source Agreement (MSA) standard, including, for example, the Quad Small Form factor Pluggable (QSFP) standard, the CXP standard, the XFP standard, or the like. In yet other embodiments, an optical transceiver assembly can include any optical transceiver, even if not manufactured according to an industry standard.

Although various embodiments have been described as having particular features and/or combinations of components, other embodiments are possible having a combination of any features and/or components from any of embodiments as discussed above. For example, in some embodiments, a data processing unit can include a thermal interface member having multiple layers, similar to the thermal interface member 310, and a printed circuit board defining a recess, similar to the printed circuit board 560.

What is claimed is:

1. An apparatus, comprising:
a thermal interface member configured to be coupled to a first surface of a printed circuit board such that a portion of the thermal interface member is in contact with a thermally-conductive portion of the first surface when the thermal interface member is coupled to the first surface, the portion of the thermal interface member being deformable and thermally-conductive, the thermal interface member having a first layer and a second layer, the first layer being tear-resistant and thermally-conductive, the second layer disposed between the first layer and the first surface of the printed circuit board when the thermal interface member is coupled to the first surface, the second layer including a first region and a second region mutually-exclusive from the first region, the first region including a first material that is deformable and thermally-conductive, the second region including a second material that is an adhesive.

2. The apparatus of claim 1, wherein the first material includes at least one of a thermally-conductive gel, a thermally-conductive grease or a phase-change material having a phase-change temperature threshold of greater than approximately 40 degrees Celsius.

3. The apparatus of claim 1, wherein an outer surface of the thermal interface member is configured to be in sliding contact with an electronic device coupled to the printed circuit board.

4. The apparatus of claim 1, wherein an outer surface of the thermal interface member is formed from a material having a static coefficient of friction less than approximately 0.5.

5. The apparatus of claim 1, wherein an outer surface of the thermal interface member is configured to contact an electronic device when the electronic device is coupled to the printed circuit board, the outer surface of the thermal interface member is formed from a material having at least one of an Elmendorf tear strength of at least 0.07 pounds or a Graves tear resistance value of at least one pound.

6. The apparatus of claim 1, further comprising:
the printed circuit board configured to be coupled to an electronic device.

7. The apparatus of claim 1, further comprising:
a frame coupled to the first surface of the printed circuit board, the frame defining, at least in part, an internal volume within which at least a portion of an electronic device can be disposed when the electronic device is coupled to the printed circuit board,
the frame defining an opening within which a portion of the thermal interface member is disposed such that the portion of the thermal interface member is in slidable contact with the electronic device.

8. An apparatus, comprising:
a printed circuit board configured to be coupled to an electronic device, a first surface of the printed circuit board including a thermally-conductive portion that is thermally coupled to a second surface of the printed circuit board;
a thermal interface member coupled to the first surface of the printed circuit board such that a portion of the thermal interface member is in contact with the thermally-conductive portion of the first surface, the portion of the thermal interface member having a first layer and a second layer, the first layer being tear-resistant and thermally-conductive, the second layer disposed between the first layer and the first surface of the printed circuit board, the second layer including at least one of a thermally-conductive gel, a thermally-conductive grease or a phase-change material having a phase-change temperature threshold of greater than approximately 40 degrees Celsius; and
a frame coupled to the first surface of the printed circuit board, the frame defining, at least in part, an internal volume within which at least a portion of the electronic device can be disposed when the electronic device is coupled to the printed circuit board, the frame defining an opening within which the portion of the thermal interface member is disposed such that the portion of the thermal interface member is in slidable contact with the electronic device.

9. The apparatus of claim 8, wherein the thermally-conductive portion of the first surface is coupled to the second surface by a thermally-conductive via between the first surface and the second surface.

10. The apparatus of claim 8, wherein the second layer includes a first region and a second region mutually-exclusive from the first region, the first region including the at least one of the thermally-conductive gel, the thermally-conductive grease or the phase-change material, the second region including a second material that is an adhesive.

11. The apparatus of claim 8, wherein an outer surface of the thermal interface member is configured to be in sliding contact with the electronic device.

12. The apparatus of claim 8, wherein an outer surface of the thermal interface member is configured to contact the electronic device when the electronic device is coupled to the printed circuit board, the outer surface of the thermal interface member is formed from a material having a static coefficient of friction less than approximately 0.5.

13. The apparatus of claim 8, wherein an outer surface of the thermal interface member is configured to contact the electronic device when the electronic device is coupled to the printed circuit board, the outer surface of the thermal interface member is formed from a material having at least one of an Elmendorf tear strength of at least 0.07 pounds or a Graves tear resistance value of at least one pound.

14. An apparatus, comprising:
a printed circuit board configured to be coupled to an electronic device, a first surface of the printed circuit board including a thermally-conductive portion that is thermally coupled to a second surface of the printed circuit board; and
a thermal interface member coupled to the first surface of the printed circuit board such that a portion of the thermal interface member is in contact with the thermally-conductive portion of the first surface, the portion of the thermal interface member being deformable and thermally-conductive,
the thermal interface member having a first layer and a second layer, the first layer being tear-resistant, the second layer disposed between the first layer and the first surface of the printed circuit board, the second layer including an adhesive and at least one of a thermally-conductive gel, a thermally-conductive grease or a phase-change material having a phase-change temperature threshold of greater than approximately 40 degrees Celsius, the adhesive being separate from the at least one of the thermally-conductive gel, the thermally- conductive grease or the phase-change material.

15. The apparatus of claim 14, wherein the first layer of the thermal interface member is characterized by at least one of an Elmendorf tear strength of at least 0.07 pounds or a Graves tear resistance value of at least one pound.

16. The apparatus of claim 14, wherein the first layer is constructed from any one of a metalized polyester film or a metalized polyimide film.

17. The apparatus of claim 14, wherein the first layer includes a metalized polymer constructed from a polymer film having a metallic coating.

* * * * *